United States Patent [19]
Cho et al.

[11] Patent Number: 5,523,615
[45] Date of Patent: Jun. 4, 1996

[54] POROUS DIELECTRIC MATERIAL WITH IMPROVED PORE SURFACE PROPERTIES FOR ELECTRONICS APPLICATIONS

[75] Inventors: Chi-Chen Cho, Richardson; Bruce E. Gnade, Dallas, both of Tex.; Douglas M. Smith, Albuquerque, N.M.

[73] Assignee: Texas Instruments Incorporated, Dallas, Tex.

[21] Appl. No.: 474,273

[22] Filed: Jun. 7, 1995

Related U.S. Application Data

[62] Division of Ser. No. 263,572, Jun. 23, 1994.

[51] Int. Cl.[6] ............................. H01L 23/58; H01L 29/40
[52] U.S. Cl. .................... 257/632; 257/637; 257/638; 257/642; 257/643; 257/758; 257/759; 257/765
[58] Field of Search ................................. 257/632, 637, 257/638, 642, 643, 758, 759, 765

[56] References Cited

U.S. PATENT DOCUMENTS

| | | | |
|---|---|---|---|
| 4,652,467 | 3/1987 | Brinker et al. | 427/246 |
| 4,987,101 | 1/1991 | Kaanta et al. | 437/228 |
| 5,103,288 | 4/1992 | Sakamoto et al. | 357/71 |
| 5,155,576 | 10/1992 | Mizushima | 357/71 |

OTHER PUBLICATIONS

Hrubesh et al., "Dielectric Properties of Aerogels", J. Mater. Res., vol. 8, No. 7, Jul. 1993, pp. 1736–1741.

*Primary Examiner*—Sara W. Crane
*Assistant Examiner*—Alice W. Tang
*Attorney, Agent, or Firm*—James E. Harris; Richard A. Stoltz; Richard L. Donaldson

[57] ABSTRACT

This invention provides an improved porous structure for semiconductor devices and a process for making the same. This process may be applied to an existing porous structure 28, which may be deposited, for sample, between patterned conductors 24. The process may include baking the structure in a reducing atmosphere, preferably a forming gas, to dehydroxylate the pore surfaces. The process may include baking the structure in a halogen-containing atmosphere to bond halogens to the pore surfaces. It has been found that a porous structure treated in such a manner generally exhibits improved dielectric properties relative to an untreated sample.

6 Claims, 3 Drawing Sheets

POROUS DIELECTRIC MATERIAL WITH IMPROVED PORE SURFACE PROPERTIES FOR ELECTRONICS APPLICATIONS

CROSS-REFERENCE TO RELATED APPLICATIONS

This is a division of application Ser. No. 08/263,572, filed Jun. 23, 1994.

The following co-assigned U.S. patent applications are hereby incorporated herein by reference:

| TI Case | Ser. No | Filing Date | Inventor | Title |
| --- | --- | --- | --- | --- |
| TI-18941 | 08/247195 | 5/20/94 | Gnade et al | A Low Dielectric Constant Material For Electronics Applications |
| TI-19072 | 08/246432 | 5/20/94 | Havemann et al | Interconnect Structure with an Integrated Low Density Dielectric |
| TI-19253 | 08/250142 | 5/27/94 | Havemann et al | Two-Step Metal Etch Process For Selective Gap Fill of Submicron Interconnects and Structure For Same |
| TI-19178 | 08/255157 | 6/07/94 | Gnade et al | Porous Composites as a Low Dielectric Constant Material for Electronics Applications |

FIELD OF THE INVENTION

This invention relates generally to the fabrication of dielectrics on semiconductor devices, and more particularly to methods for reducing capacitive coupling on a semiconductor device using electrical insulators made of porous dielectric: materials.

BACKGROUND OF THE INVENTION

Semiconductors are widely used in integrated circuits for electronic devices such as computers and televisions. These integrated circuits typically combine many transistors on a single crystal silicon chip to perform complex functions and store dam. Semiconductor and electronics manufacturers, as well as end users, desire integrated circuits which can accomplish more in less time in a smaller package while consuming less power. However, many of these desires are in opposition to each other. For instance, simply shrinking the feature size on a given circuit from 0.3 microns to 0.25 microns can increase power consumption by 30%. Likewise, doubling operational speed generally doubles power consumption. Miniaturization also generally results in increased capacitive coupling, or crosstalk, between conductors which carry signals across the chip. This effect both limits achievable speed and degrades the noise margin used to insure proper device operation.

One way to diminish power consumption and crosstalk effects is to decrease the dielectric constant of the insulator, or dielectric, which separates conductors. Probably the most common semiconductor dielectric is silicon dioxide, which has a dielectric constant of about 3.9. In contrast, air including partial vacuum) has a dielectric constant of just over 1.0. Consequently, many capacitance-reducing schemes have been devised to at least partially replace solid dielectrics with air.

U.S. Pat. No. 5,103.288, issued to Sakamoto, on Apr. 7, 1992. describes a multilayered wiring structure which decreases capacitance by employing a porous dielectric with 50% to 80% porosity (porosity is the percentage of a structure which is hollow) and pore sizes of roughly 5 nm to 50 nm. This structure is typically formed by depositing a mixture of an acidic oxide and a basic oxide heat treating to precipitate the basic oxide, then dissolving out the basic oxide. Dissolving all of the basic oxide out of such a structure may be problematic, because small pockets of the basic oxide may not be reached by the leaching agent. Furthermore, several of the elements described for use in the basic oxides (including sodium and lithium) are generally considered contaminants in the semiconductor industry, and as such are usually avoided in a production environment. Creating only extremely small pores (less than 10 nm) may be difficult using this method, yet this requirement will exist as submicron processes continue to scale towards a tenth of a micron and less.

Another method of forming porous dielectric films on semiconductor substrates (the term "substrate" is used loosely herein to include any layers formed prior to the conductor/insulator level of interest) is described in U.S. Pat. No. 4,652,467, issued to Brinker et al., on Mar. 24, 1987. This patent teaches a sol-gel technique for depositing porous films with controlled porosity and pore size (diameter), wherein a solution is deposited on a substrate, gelled, and then cross-linked and densified by removing the solvent through evaporation, thereby leaving a porous dielectric. This method has as a primary objective the densification of the film, which teaches away from low dielectric constant applications. Dielectrics formed by this method are typically 15% to 50% porous, with a permanent film thickness reduction of at least 20% during drying. The higher porosities (e.g. 40%–50%) can only be achieved at pore sizes which are generally too large for such microcircuit applications. These materials are usually referred to as xerogels, although the final structure is not a gel, but an open-pored (the pores are generally interconnected, rather than being isolated cells) porous structure of a solid material.

SUMMARY OF THE INVENTION

The present invention provides methods for modifying surface properties of porous dielectric layers on semiconductor devices and porous structures with modified pore surface chemistry. It is recognized herein that extremely porous dielectric layers (porosity generally greater than 50% and preferably greater than 75%) may provide a low dielectric constant insulation for decreasing unwanted capacitive coupling on semiconductor devices. A heretofore unrecognized problem with such porous layers is the degree to which the surface composition of the internal pore surfaces may affect dielectric properties such as dielectric constant, resistivity, dielectric breakdown voltage, and dielectric loss factor (a measure of the relative energy consumed by the dielectric of a capacitor during charging).

It has now been recognized that significant changes in the aforementioned dielectric properties may be effected by removing and/or replacing surface groups (particularly hydroxyl groups) initially present on the pore surfaces of porous dielectrics. The dielectric properties of the solid phase of such porous materials appear to be greatly affected by surface species. Because of high surface area (roughly 1000 $m^2g^{-1}$ is typical of porous dielectrics), it is herein recognized that highly polar species (e.g. hydroxyl groups) may affect dielectric properties greatly (the dielectric constant of water, which consists of hydroxyl groups bound to hydrogen, is 78). For example, a fully hydroxylated porous dielectric (1000 $m^2g^{-1}$ surface area) may contain roughly 14 wt % surface hydroxyls, and an additional 6 wt % of bound water attached to these hydroxyls.

Others have recognized other detrimental effects (e.g. foaming, infrared absorption) of high quantities of hydroxyl surface groups for sintered gels and other silica products such as those used in the fiber optics industry. As such techniques such as high temperature dehydroxylation, chemical dehydoxylation through surface reaction with halogen-containing gasses, or combinations of these techniques have been developed. It is recognized herein that techniques applicable to sintered glass, solid substrates, and the like may be unsuited for a porous semiconductor dielectric, where compatibility with other layers of the device (such as aluminum-containing conductors) and preservation of the porous structure are generally important considerations. In accordance with the present invention, methods described herein may be used to remove surface groups from a porous dielectric, preferably before creating non-porous layers on top of the porous layer. In particular, methods of dehydroxylation are presented which are chemically and thermally compatible with semiconductor fabrication. These methods may be used to improve one or more of the aforementioned dielectric properties without significant change to the mechanical properties of a porous dielectric or breakdown of other device construct.

The present invention provides a method of heat treating a porous dielectric formed on a semiconductor device for the removal of surface groups (including, preferably, at least 70%, and more preferably, at least 90% of surface hydroxyl (OH) groups). The method may comprise, before capping the porous dielectric layer, baking the device at one or more temperatures in the range of 100 C to 490 C (preferably 300 C to 450 C). The method may further comprise carrying out the baking step in a reducing atmosphere, preferably an $H_2$-containing, substantially oxygen-free atmosphere, and more preferably in a forming gas (approximately 10% $H_2$, 90% $N_2$ by volume). Alternately, or in addition to the forming gas step, the method may comprise carrying out the being step in an atmosphere which contains fluorine compounds (e.g. ammonium fluoride, hydrogen fluoride, fluorine gas) which react with the hydroxyl groups on the surface. Note that while chlorine compounds (e.g. carbon tetrachloride, silicon tetrachloride, chlorine gas) might be usable, they are preferably avoided as they may cause corrosion problems in aluminum conductors. The method may further comprise maintaining the atmosphere at or below ambient pressure during the baking step (preferably at ambient pressure). Preferably, the baking process reduces the thickness of the porous dielectric by less than 5%.

The present invention provides a structure for semiconductor devices, which may comprise a porous dielectric layer with at least 20% porosity (preferably at least 50% porosity) deposited at least partially between patterned conductors on a substrate. The porous dielectric may contain less than 1.5 OH groups/$nm^2$ (preferably less than 0.5 OH groups/$nm^2$). The porous dielectric may contain fluorine-containing surface groups, preferably in a concentration of greater than 0.8 groups/$nm^2$. The device may further comprise a substantially solid cap layer deposited over the porous dielectric layer.

BRIEF DESCRIPTION OF THE DRAWINGS

This invention, including features and advantages thereof, can be best understood by reference to the following drawings, wherein.

DETAILED DESCRIPTION OF THE PREFERRED EMBODIMENTS

Typical embodiments of the invention are described with a porous dielectric method of depositing a solution, gelling it on the substrate, surface modification, and drying to form a porous dielectric from the wet gel. All steps detailed for this process may not be required in a given embodiment. Furthermore, materials may be substituted in several of the steps to achieve various effects, and processing parameters such as times, temperatures, pressures, and relative concentrations of materials may be varied over broad ranges. In any case, another method which produces a similar porous dielectric layer could be substituted for the described method.

Figure 1A:
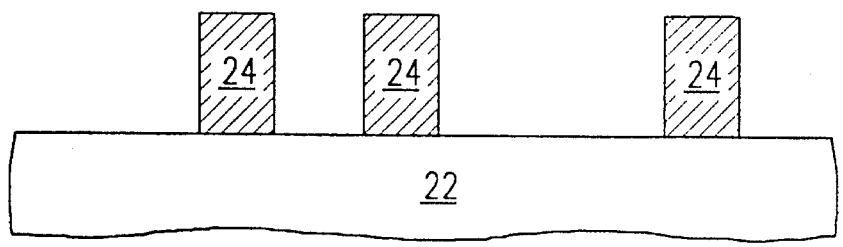
FIGS. 1A–1D show cross-sections of a portion of a semiconductor device, illustrating several steps in the application of an embodiment of the invention to a typical device.
Figure 1B:
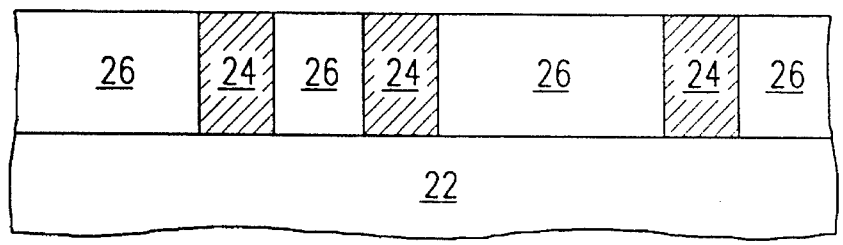
Figure 1C:
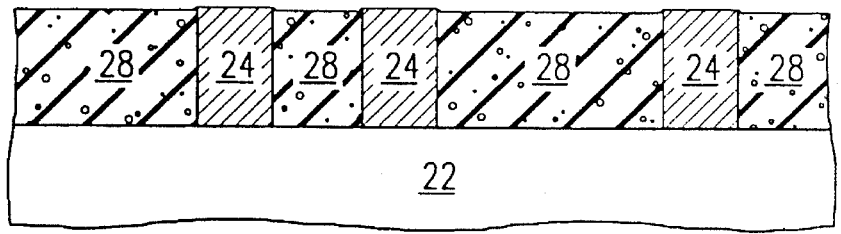

As an introduction, FIGS. 1A–1D illustrate a semiconductor structure at several steps in the formation of a dielectric layer. In FIG. 1A, three patterned conductors 24 (e.g. of aluminum alloyed with a small amount of copper) are shown formed on an insulating layer 22 (e.g. $SiO_2$), which may contain vias or through holes (not shown) for providing electrical contact between conductors 24 and lower layers of the device. In FIG. 1B, a gel precursor solution (some of which are described in detail in the specific chemical examples) is shown after disposition and gelling in the gaps between conductors 24 to form a wet gel sublayer 26. The method of application may be, for example, a spin-on technique in a controlled atmosphere which limits solvent evaporation. The precursor may be prepared, for example, by the following 2-step process. First, TEOS stock, a mixture of tetraethylorthosilicate (TEOS), ethanol, water, and HCl, in the approximate molar ratio 1:3:1:0.0007. is prepared by stirring these ingredients under constant reflux at 60 degrees C. for 1.5 hours. Secondly, 0.05 M ammonium hydroxide is added to the TEOS stock. 0.1 ml for each ml of TEOS stock. After the solution is applied to the wafer, care should be taken to insure that the thin film does not dry prematurely; preferably, the wafer containing the solution/gel generally remains immersed either in liquid or in a saturated atmosphere at all times prior to the drying stage. The precursor solution may preferably be gelled on the substrate, a process which typically takes from 1 minute to 12 hours, depending on the solution and method of gelling. The wet gel can be allowed time to age, generally about a day (although it may be much shorter), at one or more controlled temperatures. Gelation and aging may preferably be accomplished by letting the device sit in a saturated ethanol atmosphere for approximately 24 hours at about 37 degrees C.

Next, the water may be removed from the wet gel, preferably by immersing the wafer in pure ethanol. In this example, a surface modification step is performed on the wet gel, replacing a substantial number of the molecules on the pore walls with those of another species. Surface modification may be performed, for example, by immersing the wafer in a hexane solution containing about 10% by volume trimethylchlorosilane (TMCS). This surface modification typically replaces reactive surface groups such as hydroxyls and alkoxyls with more stable surface groups such as methyl groups, thereby controlling undesirable condensation reactions (and shrinkage effects) during gel drying. It has been discovered that by controlling the percentage of reactive surface groups replaced during the surface modification, the final shrinkage may be adjusted from the large shinkage typical of an unmodified xerogel (with uncontrolled shrinkage) to a shrinkage of only a few percent, heretofore only achievable with a supercritical aerogel technique. Typically, approximately 30% of the reactive surface groups must be replaced to substantially alleviate densification. Furthermore, the replacement surface species may be chosen because of its wetting properties in combination with specific pore fluids: the surface modification may result in a pore fluid contact angle closer to 90 degrees, which is desirable because of a corresponding decrease in capillary forces in the gel structure during drying. It is believed that the surface modification prevents surface condensation reactions, and may also reduce capillary pressure by changing pore fluid contact angle, thereby allowing pores in the surface modified gel to better survive drying.

After a brief reaction time, the unreacted surface modification compound is usually removed by immersing the wafer in an aprotic solvent (e.g. acetone, hexane) and allowing excess solvent to drain. After this solvent exchange, solvent is finally allowed to evaporate from wet gel 26. This may produce a structure similar to that of FIG. 1C, which illustrates the dried gel now forming a porous dielectric layer 28, and also illustrates the few percent shrinkage typical of this method (the dried porous film thickness is only slightly less than the wet gel thickness).

Figure 1D:
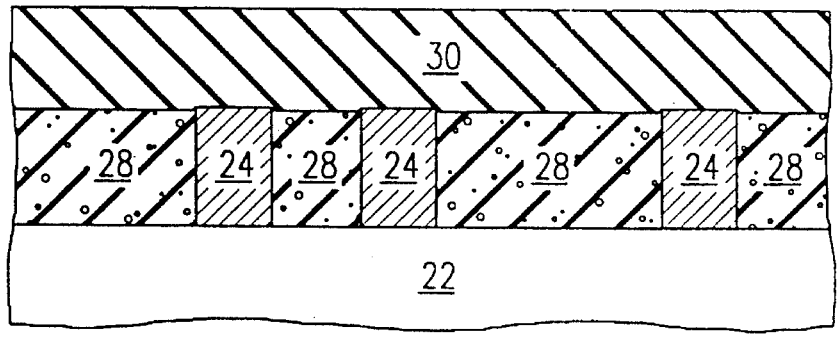

Finally, depending on the porosity and thickness selected for sublayer 28, it may be preferable to follow the drying process with deposition of non-porous dielectric layer 30, as shown in FIG. 1D. This layer may preferably be composed of silicon dioxide deposited by a chemical vapor deposition (CVD) technique. Preferably, the dehydroxylation methods presented in this invention are carried out before deposition of non-porous dielectric layer 30.

As an example, one embodiment of the method of the invention is discussed herein as applied to a wafer containing a porous layer deposited over a silicon substrate, with the porous layer having an approximate thickness of 1.5 microns. The measured porosity of the sample is 84%, and it is believed that about 65% of the surface OH groups originally present on the wet gel were replaced with methyl groups prior to drying.

Figure 2A:
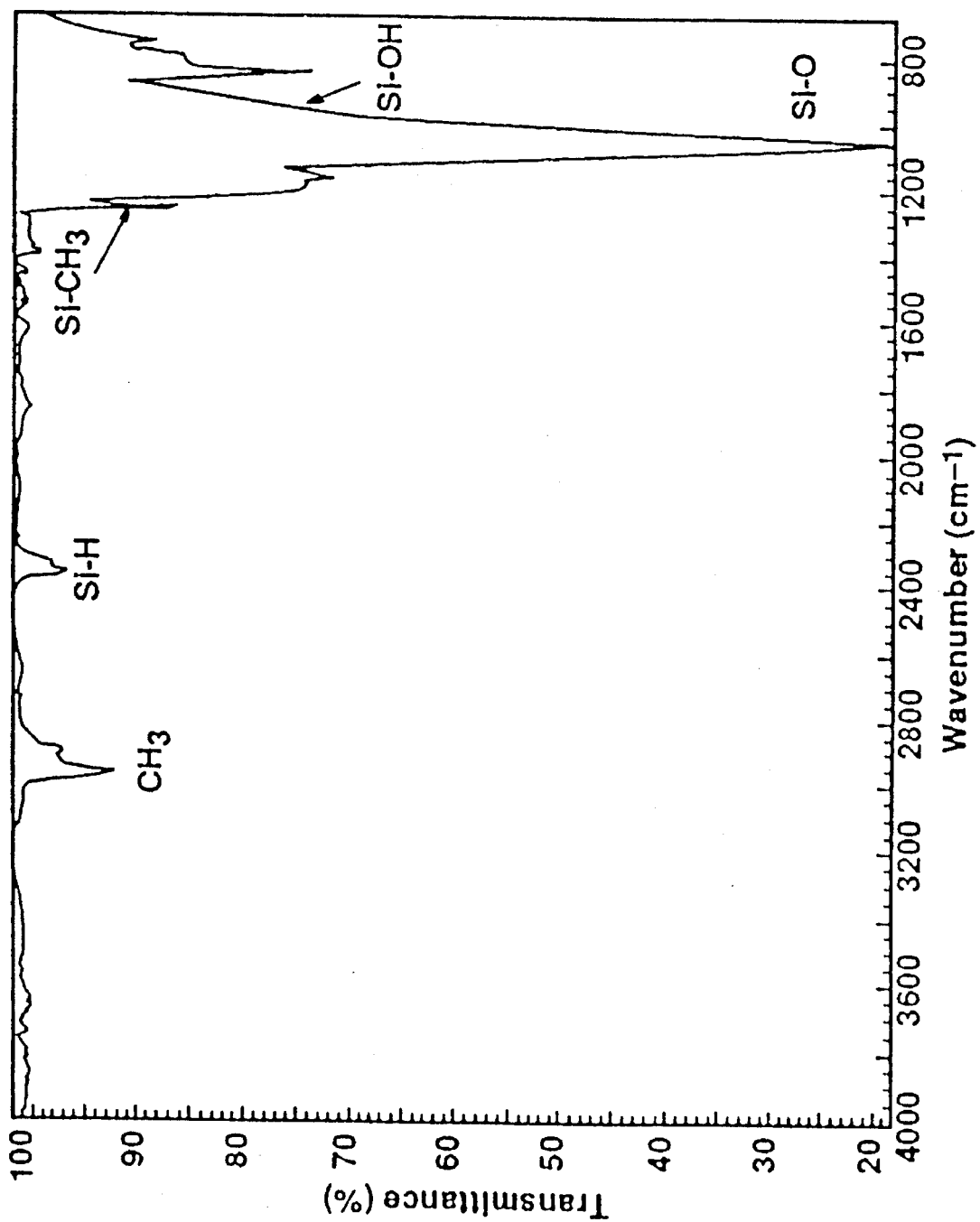
FIGS. 2A and 2B contain Fourier Transform Infrared (FTIR) transmission spectra of the same dielectric layer, respectively before and after heating in a forming gas.

FIG. 2A, obtained by FTIR spectroscopy, shows the transmittance of the porous dielectric of the wafer described above, as a function of wavenumber. Specific molecular structures absorb energy at discrete wavenumbers, forming a signature which is generally unique to a structure. Therefore, the absorption peaks (which actually peak downwards in FIG. 2A, since the graph shows transmittance) indicate the: presence of various molecular structures in the porous dielectric. Several peaks are labelled in this figure, including $CH_3$ and $Si-CH_3$ peaks, which indicate that the surface modification does place methyl groups on the pore walls, and a large Si-O peak corresponding to the material which forms most of the porous dielectric. Note also the Si-OH peak, shown as a knee on the Si-O peak, indicating that some OH groups are still present on the pore walls. Because the Si-O and Si-OH bands overlap, both contribute to the 18% transmittance peak at around 1050 wavenumbers.

Measurements taken on the sample porous dielectric indicate a dielectric constant of about 1.34, which is almost 10% higher than the theoretical value for a 16% dense structure where the solid phase has the dielectric constant of bulk silica. Surprisingly, other measurements indicate breakdown voltage and leakage (due to low resistivity) far inferior to those of bulk silica. It is believed that these discrepancies are primarily due to the effect of surface species, which are shown in FIG. 2A to be comprised substantially of hydroxyl and methyl groups. Theoretically, a fully hydroxylated silica surface contains about 4.9 OH groups/$nm^2$. It is recognized herein that for dielectric purposes, it may be desirable to reduce this concentration below 1.5 OH groups/$nm^2$, and preferably below 0.5 OH groups/$nm^2$.

Techniques commonly found in other industries for removing hydroxyl (see *Sol-Gel Science. The Physics and Chemistry of Sol-Gel Processing*, Chapter 10. by C. J. Brinker et al. Academic Press, 1990) groups from a dried gel (known as dehydroxylation) generally teach that high temperatures (usually at least 700 to 800 C) are required for effective removal. Furthermore, other known applications of dried silica gels generally teach that densification, or sintering, of the gel is desirable. However, the common use of aluminum alloy conducting layers in the semiconductor industry generally requires that no processing temperatures (including heating for dehydroxylation of porous dielectrics) exceed about 450 C after metal deposition. In addition, sintering of a dried gel deposited for its low dielectric constant defeats the original purpose of the deposition.

The present invention includes a group of dehydroxylation techniques which may be applied to a semiconductor device during fabrication, at temperatures generally at or below 490 C, and at a range of pressures from vacuum to near-critical, with atmospheric pressure being preferable due to ease of handling and compatibility with previous porous layers. These techniques may either remove a portion of the surface groups entirely (in which case it is believed that highly strained Si-O-Si bonds may be formed on the pore surfaces), or replace the surface chemistry with other, preferably less polar systems (such as hydrogen or fluorine).

Figure 2B:
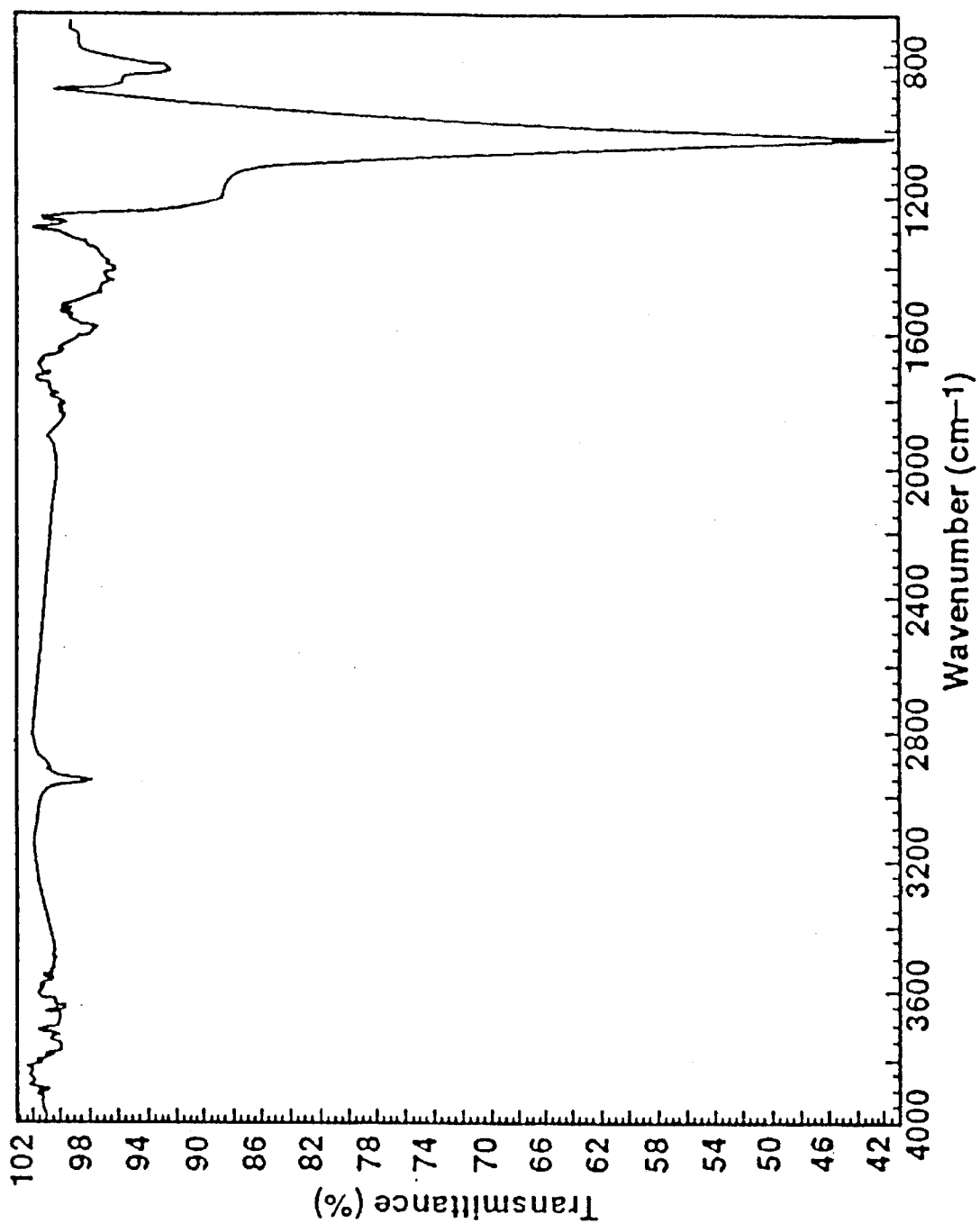

In an example of one embodiment of the invention, a structure (e.g. that of the example wafer) is placed in a forming gas atmosphere comprised of 10 vol % $H_2$, 90 vol % $N_2$ at atmospheric pressure, and baked at 450 C for approximately 30 minutes. The resulting structure is slightly densified, with a measured porosity of 80% for the initially 84% porous example. It is believed that the observed densification is due to the creation of strained Si-O-Si bonds at neighboring surface sites where OH groups and/or methyl groups are removed. FIG. 2B shows an FTIR transmission spectra for the porous dielectric of the example, after baking in a forming gas. Surprisingly, peaks corresponding to surface species on FIG. 2A are either sharply reduced or non-existent in FIG. 2B. In particular, the Si-OH knee on the Si-O peak is gone, and the combined Si-O, Si-OH transmission minima shows a 40% transmission, where before there was 18% transmission. Also, the $CH_3$ peak, which previously showed 92% transmission, now show 98% transmission, it is believed that the forming gas treatment removes over 90% of the surface hydroxyls and 75% of the methyl groups on a sample of this type.

An additional benefit of the forming gas treatment is increased hydrophobicity. As disclosed previously, the surface modified xerogels are inherently hydrophobic. Experiments performed on the porous structure before and after the forming gas treatment show increased hydrophobicity as a result of the treatment.

The invention may also comprise the steps of placing the device in an atmosphere which contains fluorine compounds (e.g. ammonium fluoride, hydrogen fluoride, fluorine gas) which react with the hydroxyl groups on the surface. These methods also are generally limited to temperatures of 450 C, and therefore may not provide the same level of dehydroxylation provided by the forming gas technique. However, an additional advantage of at least partially fluorinating the porous surface may be oleophobicity. The resulting structure may not only resist penetration by water, but by oils and alcohols also. This allows wet deposition techniques to be performed directly over the porous layer, since such a structure resists wetting by most chemicals.

The following table provides an overview of some embodiments cross-referenced to the drawings.

| Drawing Element | Preferred or Specific Examples | Generic Term | Other Alternate Examples |
|---|---|---|---|
| 22 | Previous interlayer dielectric | Insulating layer | Previously-formed layers of a semiconductor device, substrate |
| 24 | AlCu alloy and/ or refractory metal | Conductors | Al, Cu, Mo, W, Ti, and alloys of these Polysilicon, silicides, nitrides, carbides |
| 26 | TEOS stock | Precursor solution | Solution of particulate or colloidal silicon, germanium, titanium, aluminum silicate ratioed TEOS/MTEOS (methyltriethoxysilane) stock, ratioed TEOS/BTMSE (1,2-Bis(trimethoxysilyl)-ethane) stock |
| 28 | Surface-modified dried gel | Porous dielectric sublayer | Supercritically-dried aerogel, other fine-pored porous dielectrics |
| 30 | Silicon dioxide | Non-porous dielectric layer | Other oxides, B or P-doped $SiO_2$, silicon nitride, silicon oxynitride Parylene, polyimides, organic-containing oxide |

The invention is not to be construed as limited to the particular examples described herein, as these are to be regard as illustrative, rather than restrictive. The invention is intended to cover all processes anti structures which do not depart from the spirit and scope of the invention. For example, the invention is primarily directed to improving dielectric properties of a porous layer, and such a layer may be used in many semiconductor device structures other than the specific structures shown herein. Properties of some of the specific examples may be combined without deviating from the nature of the invention.

What is claimed is:

1. A semiconductor device which comprises:
   (a) a layer of patterned conductors formed on a substrate;
   (b) a porous dielectric layer disposed at least partially between at least one pair of said patterned conductors, said porous dielectric layer having a porosity of at least 20%, an average pore diameter of between 2 nm and 80 nm, and an OH concentration of less than 1.5 OH groups/$nm^2$ of pore surface area.

2. The semiconductor device of claim 1, wherein said OH concentration of said porous dielectric layer is less than 0.5 OH groups/$nm^2$.

3. The semiconductor device of claim 1, wherein said porous dielectric is comprised substantially of silicon dioxide.

4. The semiconductor device of claim 1, wherein halogen-containing groups are bonded to the pore surfaces of said porous dielectric, wherein said halogen-containing groups exist in a concentration of greater than 0.8 groups/$nm^2$.

5. The semiconductor device of claim 4, wherein said halogen containing groups are comprised of atomic fluorine.

6. The semiconductor device of claim 1, further comprising a substantially solid cap layer deposited over said porous dielectric.

* * * * *